(12) United States Patent
Alptekin et al.

(10) Patent No.: US 8,603,881 B1
(45) Date of Patent: Dec. 10, 2013

(54) RAISED TRENCH METAL SEMICONDUCTOR ALLOY FORMATION

(71) Applicant: International Business Machines Corporation, Armonk, NY (US)

(72) Inventors: Emre Alptekin, Wappingers Falls, NY (US); Ahmet S. Ozcan, Pleasantville, NY (US); Viraj Y. Sardesai, Poughkeepsie, NY (US); Cung D. Tran, Newburgh, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/623,292

(22) Filed: Sep. 20, 2012

(51) Int. Cl.
*H01L 21/336* (2006.01)

(52) U.S. Cl.
USPC ............ 438/300; 438/62; 438/630; 438/648; 438/649; 257/E21.409

(58) Field of Classification Search
USPC ........................................................ 438/300
See application file for complete search history.

(56) References Cited

U.S. PATENT DOCUMENTS

| | | | |
|---|---|---|---|
| 5,130,268 A | 7/1992 | Liou et al. | |
| 6,306,723 B1 | 10/2001 | Chen et al. | |
| 6,323,130 B1 | 11/2001 | Brodsky et al. | |
| 7,749,877 B2 | 7/2010 | Carta et al. | |
| 7,786,538 B2 * | 8/2010 | Tsuchiaki | 257/384 |
| 7,943,512 B2 | 5/2011 | Chen et al. | |
| 8,039,378 B2 | 10/2011 | Okada et al. | |
| 2008/0164491 A1 | 7/2008 | Liu et al. | |

* cited by examiner

*Primary Examiner* — Angel Roman
(74) *Attorney, Agent, or Firm* — Scully, Scott, Murphy & Presser, P.C.; Catherine Ivers

(57) ABSTRACT

A contact via hole is formed through at least one dielectric layer over a semiconductor substrate. A semiconductor material is deposited at the bottom of the contact via hole and atop the at least one dielectric layer by ion cluster deposition. An angled oxygen cluster deposition is performed to convert portions of the semiconductor material on the top surface of the at least one dielectric layer into a semiconductor oxide, while oxygen is not implanted into the deposited semiconductor material at the bottom of the contact via hole. A metal semiconductor alloy is formed at the bottom of the contact hole by deposition of a metal and an anneal. The semiconductor oxide at the top of the at least one dielectric layer can be removed during a preclean before metal deposition, a postclean after metal semiconductor alloy formation, and/or during planarization for forming contact via structures.

20 Claims, 13 Drawing Sheets

RAISED TRENCH METAL SEMICONDUCTOR ALLOY FORMATION

BACKGROUND

The present disclosure generally relates to semiconductor devices, and particularly to a method of forming a raised trench metal semiconductor alloy by selective formation of semiconductor material in a trench, and structures for effecting the same.

Advanced semiconductor devices such as field effect transistors employ a trench silicide that is formed selectively at the bottom of each contact trench. During formation of a metal silicide at a bottom of a contact via trench, silicon is consumed from underneath the contact via trench. If the trench silicide overreaches into the underlying source region or the underlying drain region, the trench silicide may be formed too close to the channel of the field effect transistor, resulting in a high leakage current.

While increasing the thickness of raised source and drain regions could alleviate the overreaching of the trench silicide toward the channel region, such a change requires an accompanying increase in the height of a gate stack as well as higher process uniformity during subsequent planarization of a middle-of-line (MOL) dielectric layer at the gate level. Thus, increasing the thickness of the raised source and drain regions is not a practical option for alleviating the problem of a leakage current due to statistical overreaching of a trench silicide during manufacturing.

SUMMARY

A contact via hole is formed through at least one dielectric layer over a semiconductor substrate. A semiconductor material is deposited only at the bottom of the contact via hole and atop the at least one dielectric layer. An angled oxygen cluster deposition is performed to convert portions of the semiconductor material only on the top surface of the at least one dielectric layer into a semiconductor oxide, while oxygen is blocked from reaching the deposited semiconductor material at the bottom of the contact via hole due to implant angle. A metal semiconductor alloy is formed at the bottom of the contact hole by deposition of a metal and an anneal. The semiconductor oxide at the top of the at least one dielectric layer can be removed during a preclean before metal deposition, a postclean after metal semiconductor alloy formation, and/or during planarization for forming contact via structures.

According to an aspect of the present disclosure, a method of forming a semiconductor structure is provided. At least one dielectric layer is formed over a substrate. A trench is formed at least through the at least one dielectric layer. A first semiconductor material portion and a second semiconductor material portion are concurrently deposited at a bottom surface of the trench and at a topmost surface of the at least one dielectric layer, respectively, without depositing any material on sidewalls of the trench. One possible technique for such deposition can be gas cluster ion beam (GCIB) deposition, although other techniques may also be used to get same deposition. The second semiconductor material portion is converted into a semiconductor oxide portion while a composition of the first semiconductor material portion remains the same. One possible technique for converting only the second material into oxide is by gas cluster ion beam deposition of oxygen although other techniques may also exist.

DETAILED DESCRIPTION

Figure 1:
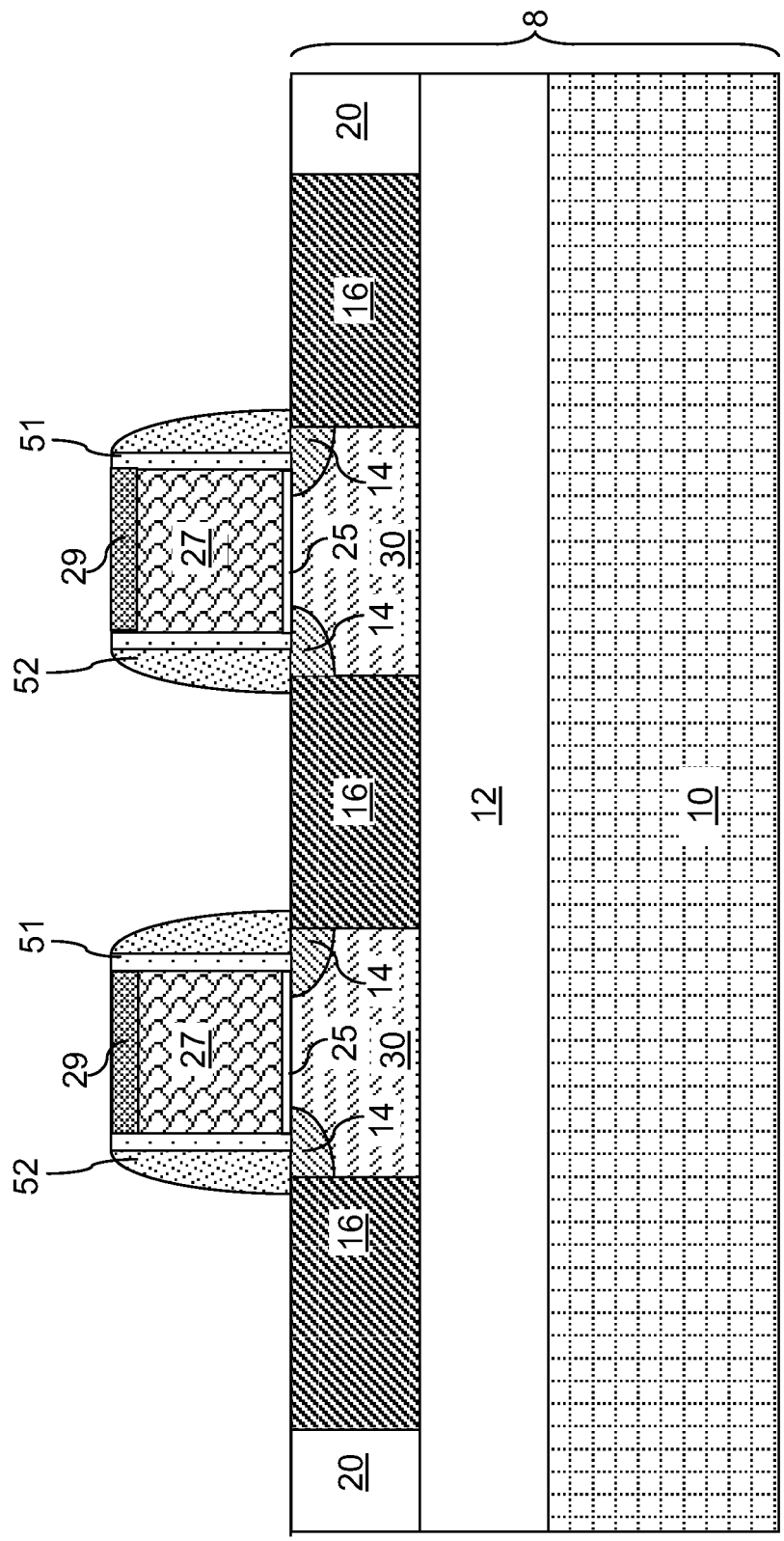
FIG. 1 is vertical cross-sectional view of an exemplary semiconductor structure after formation of disposable gate structures according to an embodiment of the present disclosure.

As stated above, the present disclosure relates to a method of forming a raised trench metal semiconductor alloy by selective formation of semiconductor material in a trench, and structures for effecting the same. Aspects of the present disclosure are now described in detail with accompanying figures. Like and corresponding elements mentioned herein and illustrated in the drawings are referred to by like reference numerals. The drawings are not necessarily drawn to scale.

Referring to FIG. 1, an exemplary semiconductor structure according to an embodiment of the present disclosure includes a semiconductor substrate 8, on which various components of field effect transistors are formed. The semiconductor substrate 8 can be a bulk substrate including a bulk semiconductor material throughout, or a semiconductor-on-insulator (SOI) substrate containing a top semiconductor layer, a buried insulator layer 12 located under the top semiconductor layer, and a bottom semiconductor layer 10 located under the buried insulator layer. In one embodiment, the top semiconductor layer of the SOI substrate or the bulk semiconductor substrate can include single crystalline silicon.

Various portions of the semiconductor material in the semiconductor substrate 8 can be doped with electrical dopants of n-type or p-type at different dopant concentration levels. For example, various portions of the top semiconductor layer can be doped with p-type dopants or n-type dopants to provide p-doped regions or n-doped regions. Shallow trench isolation structures 20 can be formed to electrically isolate the various p-doped regions and n-doped regions.

A disposable dielectric layer, a disposable gate material layer, and a disposable gate cap dielectric layer can be deposited and lithographically patterned to form disposable gate structures. For example, the disposable gate stacks may include a disposable gate structure that is a stack of a disposable dielectric portion 25, a disposable gate material portion 27, and a disposable gate cap dielectric 29. The disposable dielectric layer includes a dielectric material such as a semiconductor oxide. The disposable gate material layer includes a material that can be subsequently removed selective to dielectric material such as a semiconductor material. The disposable gate cap dielectric layer includes a dielectric material such as silicon oxide or silicon nitride. The disposable gate structures (25, 27, 29) can be formed over various doped regions in the top semiconductor layer of an SOI substrate or over a bulk semiconductor substrate. The height of the disposable gate structures (25, 27, 29) can be from 20 nm to 500 nm, and typically from 40 nm to 250 nm, although lesser and greater heights can also be employed.

Electrical dopants can be implanted into surface portions of various doped regions of the substrate 8 that are not covered by the disposable gate structures (25, 27, 29) to form source/drain extension regions 14. As used herein, "source/drain extension regions" refer to source extension regions and drain extension regions. Thus, each of the source/drain extension regions 14 can be a source extension region or a drain extension region.

At least one gate spacer can be formed on outer sidewalls of each of the disposable gate structures (25, 27, 29). For example, the at least one gate spacer can include an inner gate spacer 51 formed around a disposable gate structure (25, 27, 29) and an outer gate spacer 52 formed around an inner gate spacer 51. In one embodiment, the inner gate spacers 51 can be formed by conversion of vertical surface portions of the disposable gate material portions 27 into a dielectric material, for example, by oxidation and/or nitridation and/or by deposition of a conformal dielectric material layer and an anisotropic etch. In another embodiment, the inner gate spacers 51 can be formed by conformal deposition of a dielectric material and an anisotropic etch that removes horizontal portions of the conformally deposited dielectric material such as silicon oxide or silicon nitride. In one embodiment, the outer gate spacers 52 can be formed by deposition of another conformal dielectric material layer and an anisotropic etch. The inner gate spacers 51 can include silicon oxide, silicon nitride, silicon oxynitride, or combinations thereof. The outer gate spacers 52 can include silicon oxide, silicon nitride, silicon oxynitride, porous or non-porous organosilicate glass, or combinations thereof.

Electrical dopants can be implanted into portions of various doped regions of the substrate 8 that are not covered by the disposable gate structures (25, 27, 29) or the at least one gate spacers (51, 52) to form source/drain regions 16. As used herein, "source/drain regions" refer to source regions and drain regions. Thus, each of the source/drain regions 16 can be a source region or a drain region.

The unimplanted portions of the various doped regions that underlie the disposable gate structures (25, 27, 29) can be body regions 30 that include channels of field effect transistors to be subsequently formed.

The exemplary semiconductor structure can be modified in various ways to incorporate many of known variations in field effect transistors including, but not limited to, embedded source/drain regions, halo implantation, and variations in the at least one gate spacer.

Figure 2:
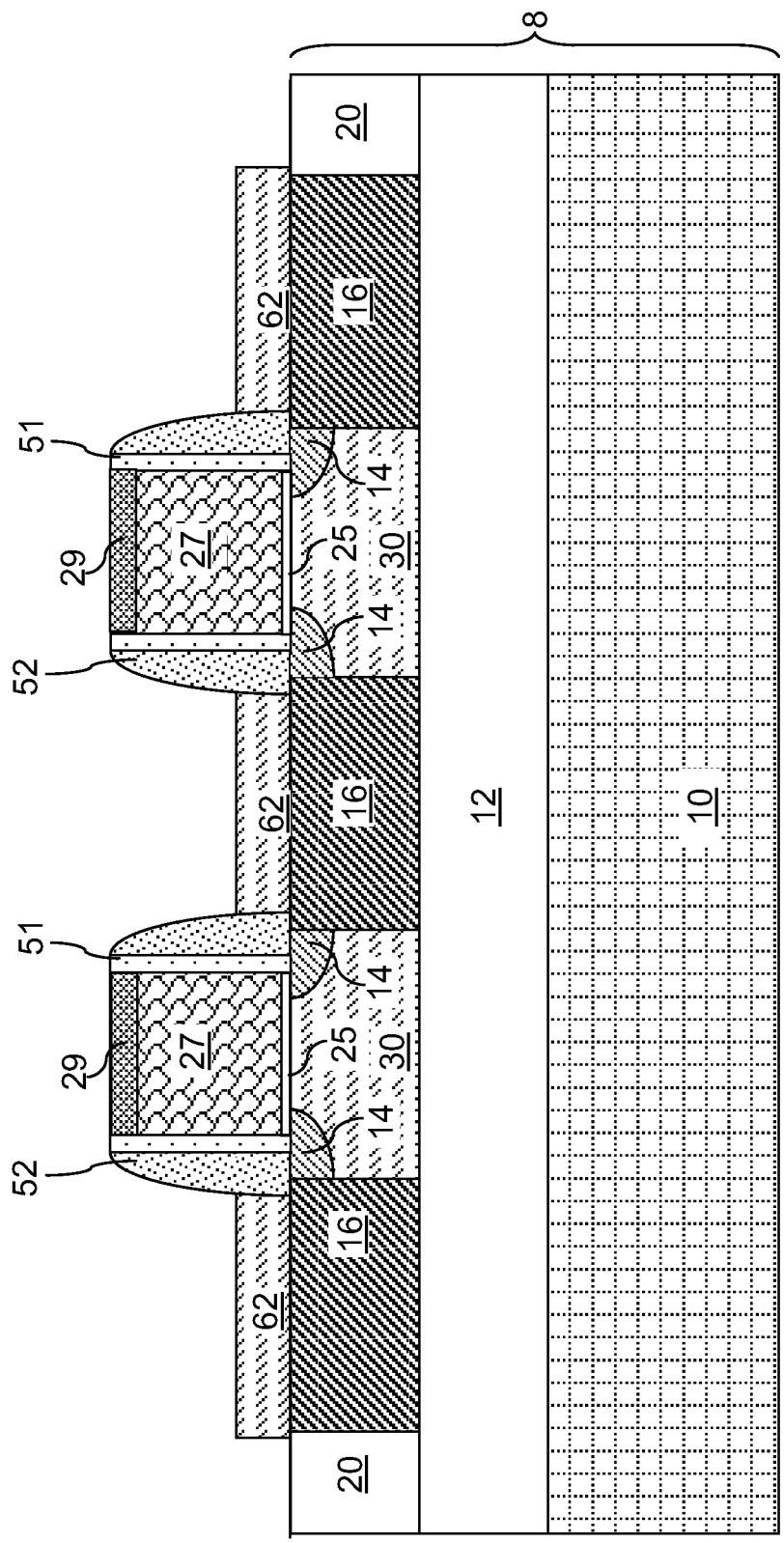
FIG. 2 is a vertical cross-sectional view of the exemplary semiconductor structure after formation of raised source/drain regions according to an embodiment of the present disclosure.

Referring to FIG. 2, raised semiconductor material regions 62 can be formed on the source/drain regions 16. In one embodiment, the raised semiconductor material regions 62 can be raised source/drain regions. As used herein, "raised source/drain regions" refer to raised source regions and raised drain regions. Thus, each of the raised semiconductor material regions 62 can be a raised source region or a raised drain region. For example, a raised semiconductor material regions 62 can be a raised source region if the underlying source/drain region 16 is a source region, and can be a raised drain region if the underlying source/drain region 16 is a drain region.

The raised semiconductor material regions 62 can be formed, for example, by selective epitaxy that deposits a semiconductor material only on semiconductor surfaces and does not deposit any semiconductor material on dielectric surfaces. The raised semiconductor material regions 62 can include the same semiconductor material as, or a different material from, the semiconductor material of the source/drain regions 16. Each of the raised semiconductor material regions 62 can be formed in epitaxial alignment with an underlying source/drain region 16. As used herein, "epitaxial alignment" refers to alignment of atoms in a same singe crystalline structure.

Figure 3:
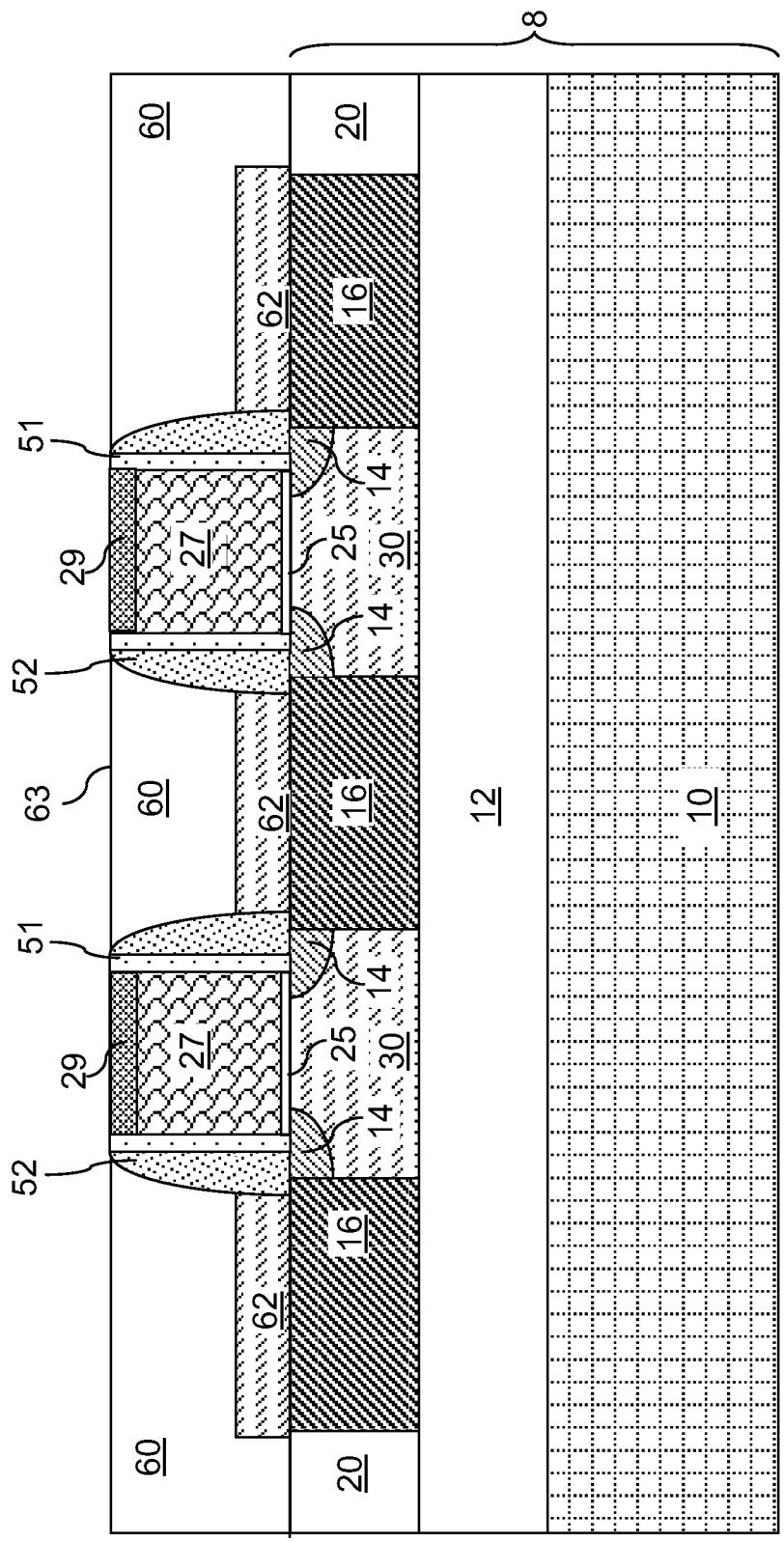
FIG. 3 is a vertical cross-sectional view of the exemplary semiconductor structure after formation of a planarization dielectric layer according to an embodiment of the present disclosure.

Referring to FIG. 3, a planarization dielectric layer 60 is deposited over the semiconductor substrate 8, the disposable gate structures (25, 27, 29), the at least one gate spacer (51, 52), and the raised semiconductor material regions 62. In one embodiment, the planarization dielectric layer 60 includes a dielectric material that can be planarized, for example, by chemical mechanical planarization. For example, the planarization dielectric layer 60 can include a doped silicate glass, an undoped silicate glass (silicon oxide), and/or porous or non-porous organosilicate glass.

The planarization dielectric layer 60 is planarized above the topmost surfaces of the disposable gate structures (25, 27, 29). The planarization can be performed, for example, by chemical mechanical planarization (CMP). The planar topmost surface of the planarization dielectric layer 60 is herein referred to as a planar dielectric surface 63.

Figure 4:
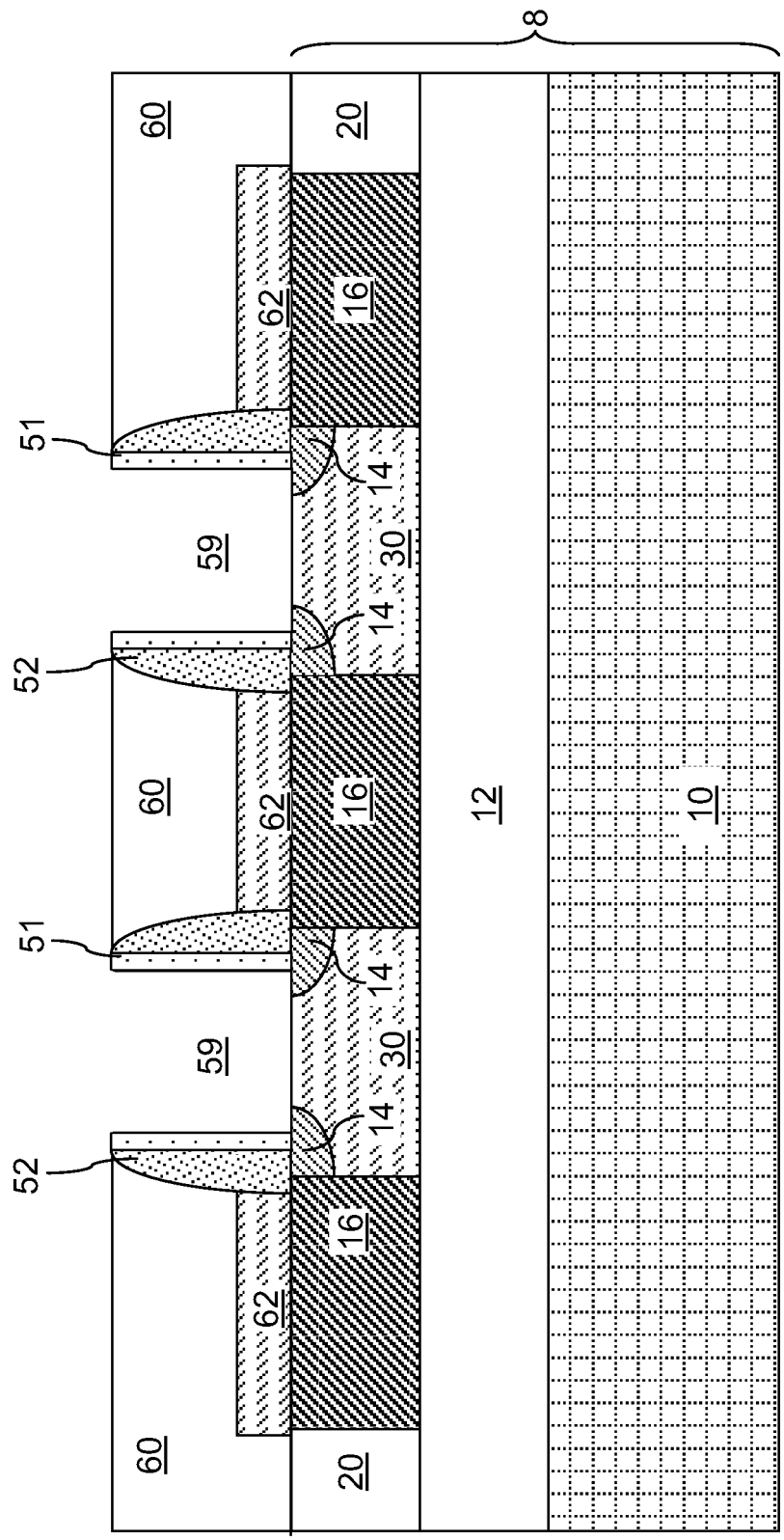
FIG. 4 is a vertical cross-sectional view of the exemplary semiconductor structure after removal of the disposable gate structures according to an embodiment of the present disclosure.

Referring to FIG. 4, the disposable gate structures (25, 27, 29) are removed by at least one etch. The at least one etch can be a recess etch, which can be an isotropic etch or anisotropic etch. The removal of the disposable gate structures (25, 27, 29) can be performed employing an etch chemistry that is selective to the at least one gate spacer (51, 52). In one embodiment, the etch employed to remove the disposable gate structures (25, 27, 29) can be selective to the dielectric materials of the planarization dielectric layer 60 and the at least one gate spacers (51, 52). Gate cavities 59 are formed in volumes from which the disposable gate structures (25, 27, 29) are removed. Semiconductor surfaces above the channels for field effect transistors can be physically exposed at the bottom of the gate cavities 59. Each gate cavity 59 can be laterally enclosed by an inner gate spacer 51 and an outer gate spacer 52.

Figure 5:
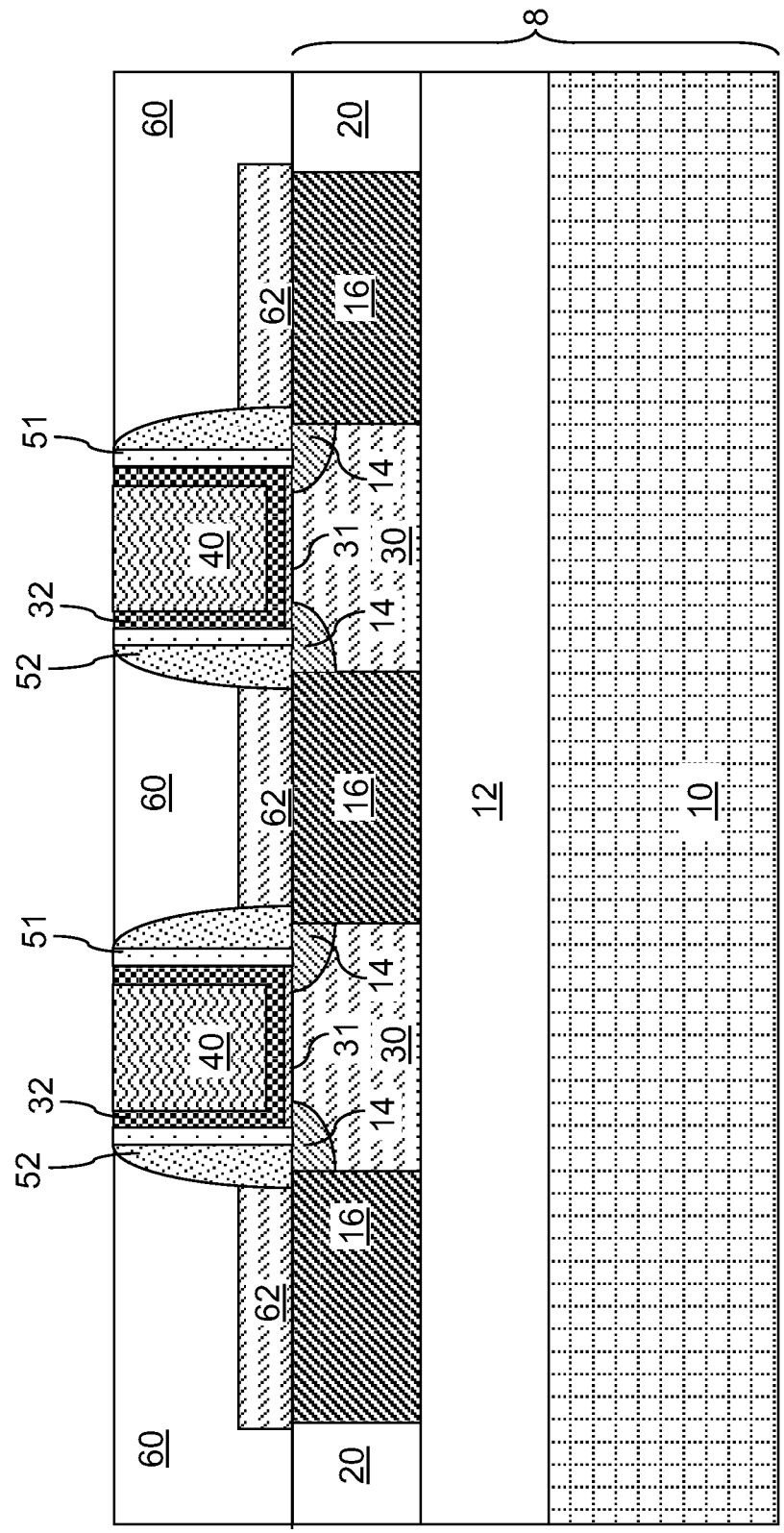
FIG. 5 is a vertical cross-sectional view of the exemplary semiconductor structure after formation of replacement gate structures according to an embodiment of the present disclosure.

Referring to FIG. 5, an interfacial dielectric layer 31 can be optionally formed on the exposed semiconductor surface at the bottom of each gate cavity 59 by conversion of surface portions of the exposed semiconductor material into a dielectric material. Each of the interfacial dielectric layers 31 can be a semiconductor-element-containing dielectric layer. The formation of the interfacial dielectric layers 31 can be effected by thermal conversion or plasma treatment.

A gate dielectric 32 and a gate electrode 40 can be formed within each gate cavity 59. For example, a vertical stack of a gate dielectric layer and at least one conductive material layer can be deposited within each gate cavity 59 and over the planarization dielectric layer 60. The gate dielectric layer can include a high dielectric constant (high-k) gate dielectric material as known in the art. The gate dielectric layer and the at least one conductive material layer can be planarized to form the gate dielectrics 32 and the gate electrodes 40, respectively. A replacement gate stack is formed within each gate cavity 59. Each replacement gate stack can include an interfacial dielectric layer, a gate dielectric 32, and a gate electrode 40. The top surfaces of each replacement gate stack (31, 32, 40) can be coplanar with the top surface of the planarization dielectric layer 60. Thus, the top surfaces of each gate dielectric 32 and each gate electrode 40 can be coplanar with the top surface of the planarization dielectric layer 60.

Figure 6:
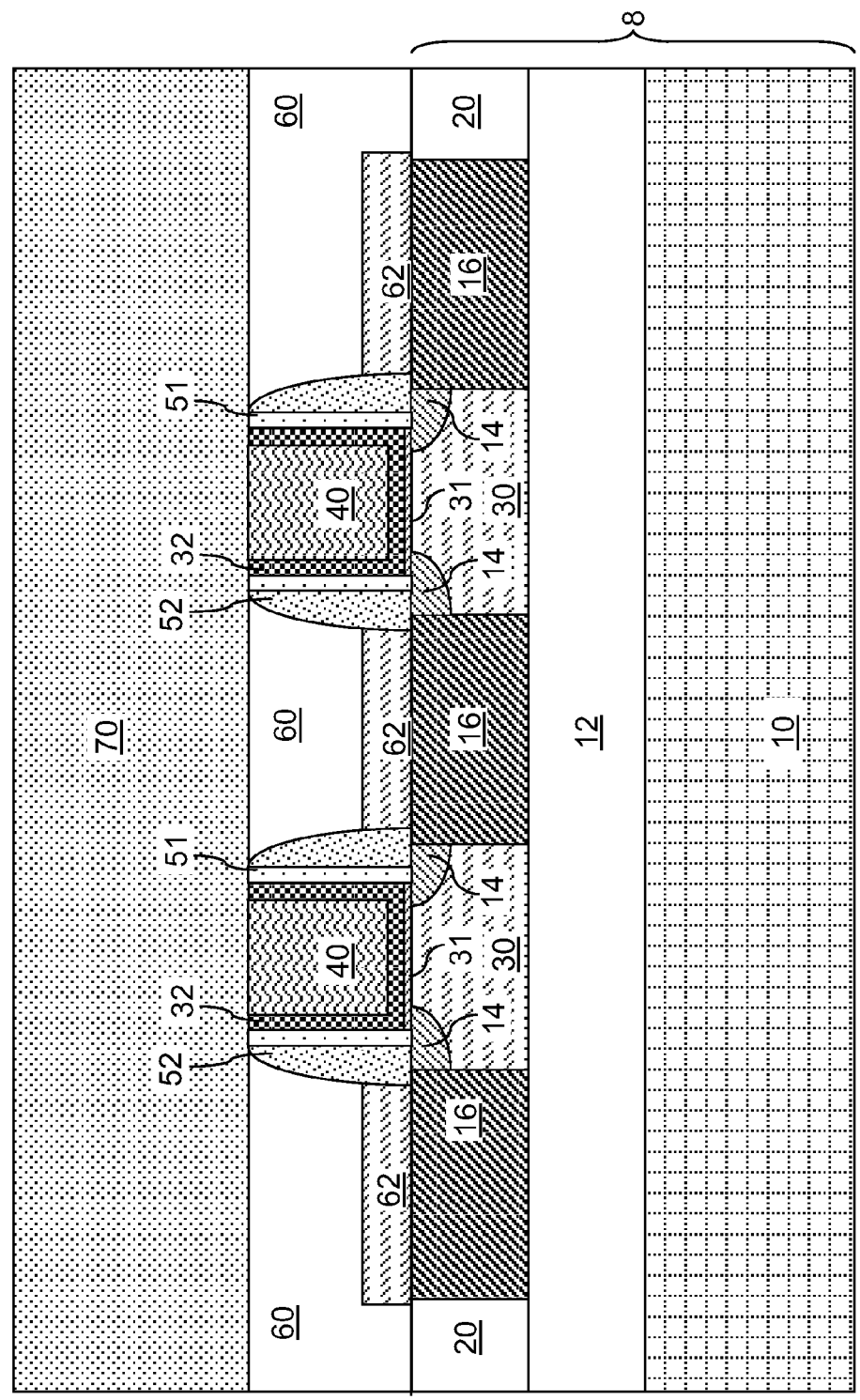
FIG. 6 is a vertical cross-sectional view of the exemplary semiconductor structure after formation of a contact-level dielectric layer according to an embodiment of the present disclosure.

Referring to FIG. 6, a contact-level dielectric layer 70 can be formed over the planarization dielectric layer 60. The contact-level dielectric layer 70 includes a dielectric material such as silicon oxide, silicon nitride, organosilicate glass, or combinations thereof. The contact-level dielectric layer 70 can be formed, for example, by chemical vapor deposition (CVD) or a spin-on coating or plasma enhanced chemical vapor deposition (PECVD). The thickness of the contact-level dielectric layer 70 can be from 50 nm to 500 nm, although lesser and greater thicknesses can also be employed. Thus, the at least one dielectric layer that is formed over the substrate 8 can include a stack of the planarization dielectric layer 60 and the contact-level dielectric layer 70.

Figure 7:
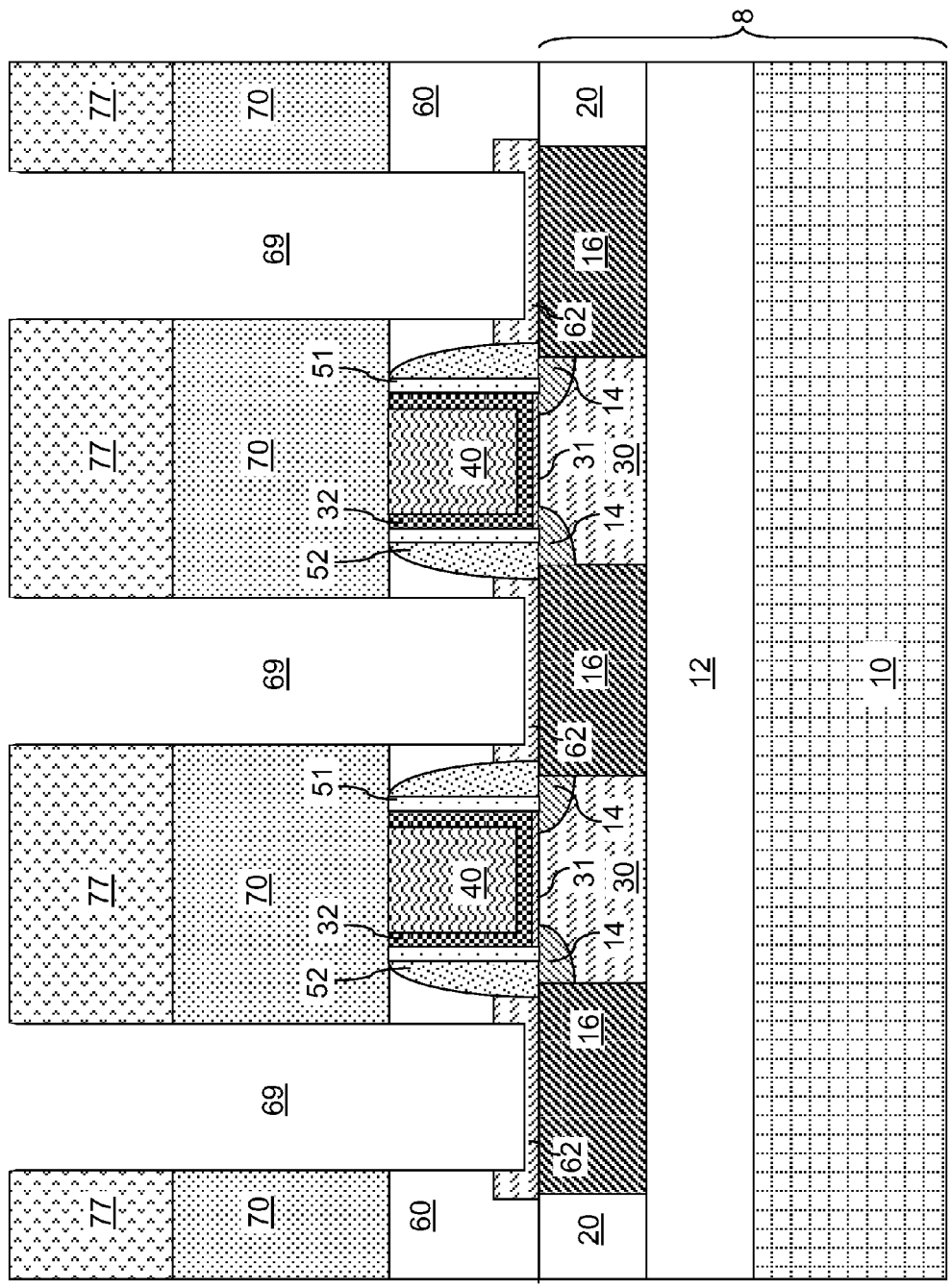
FIG. 7 is a vertical cross-sectional view of the exemplary semiconductor structure after formation of contact trenches through the contact-level dielectric layer and the planarization dielectric layer according to an embodiment of the present disclosure.

Referring to FIG. 7, a patterned mask layer 77 is formed over the contact-level dielectric layer 70. The patterned mask layer 77 includes opening in areas in which formation of contact via structures is desired. The patterned mask layer 77 can be, for example, a patterned photoresist layer that is formed by applying and lithographically patterning a layer of a photoresist material.

Trenches are formed by transferring the pattern in the patterned mask layer 77 through the contact-level dielectric layer 70, the planarization dielectric layer 60, and upper portions of the raised semiconductor material regions 62. The trenches thus formed are herein referred to as contact trenches 69, and are subsequently employed to form various contact via structures. The transfer of the pattern in the patterned mask layer 77 through the contact-level dielectric layer 70, the planarization dielectric layer 60, and upper portions of the raised semiconductor material regions 62 can be performed, for example, by at least one anisotropic etch. Thus, the raised semiconductor material regions 62 can be vertically recessed during formation of the contact trenches 69. Sidewall surfaces and a recessed top surface of the raised semiconductor material region 62 are physically exposed within each contact trench 69. The patterned mask layer 77 is subsequently removed selective to the raised semiconductor material region 62 and the dielectric layers (60, 70).

Figure 8:
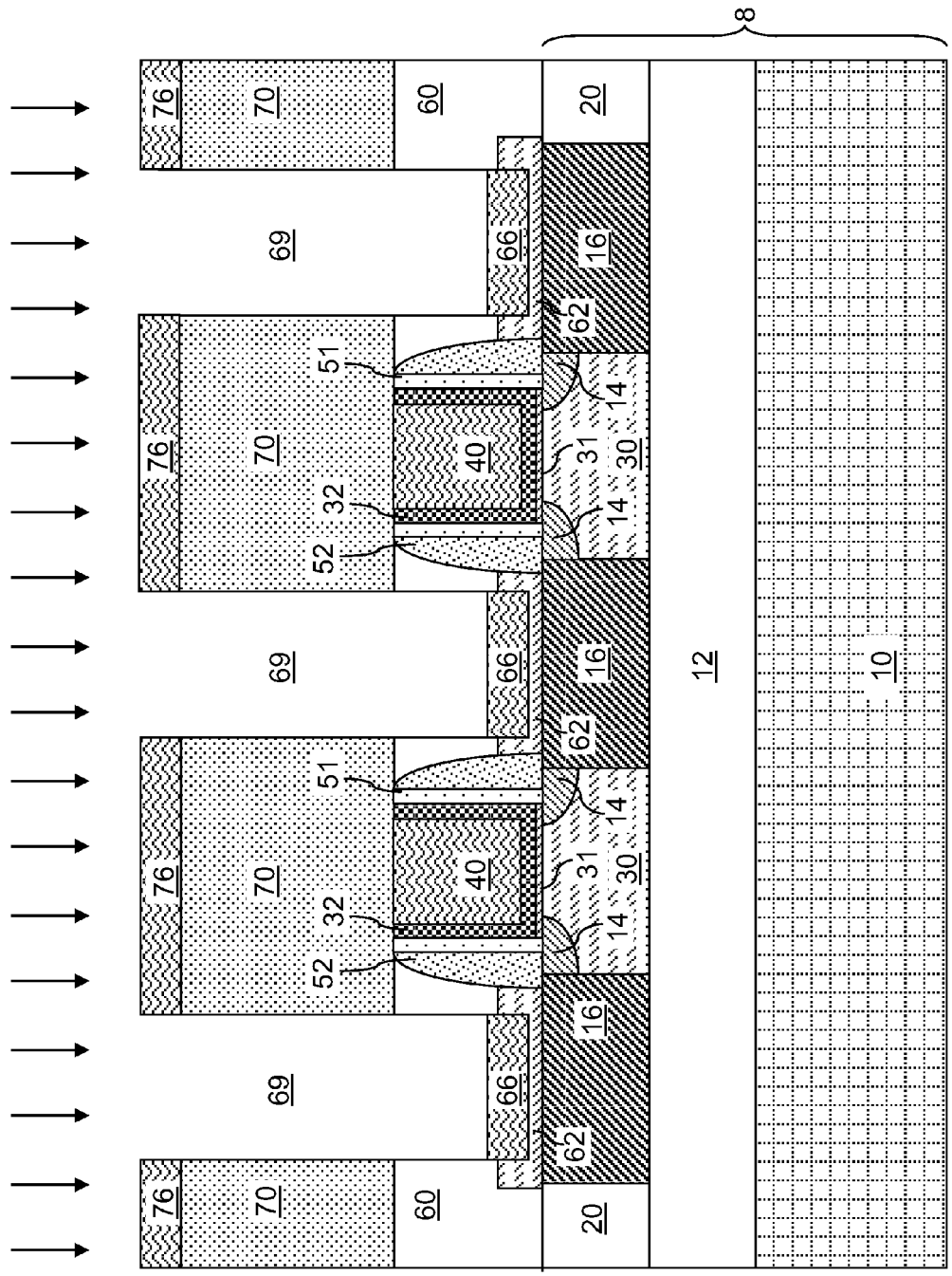
FIG. 8 is a vertical cross-sectional view of the exemplary semiconductor structure during deposition of first semiconductor material portions at the bottom of the trenches and a second semiconductor material portion on the top surface of the contact-level dielectric layer according to an embodiment of the present disclosure.

Referring to FIG. 8, a semiconductor material is deposited only on the bottom surfaces of the contact trenches 69 and the top surface of the contact-level dielectric layer 70. The semiconductor material can be deposited by gas cluster ion beam deposition along the direction perpendicular to the top surface of the contact-level dielectric layer 70. Selection of the direction perpendicular to the top surface of the contact-level dielectric layer 70 as the direction of the gas cluster ion beam minimizes deposition of the semiconductor material on sidewalls of the contact trenches 62.

First semiconductor material portions 66 are formed at the bottom of the contact trenches 69, and a second semiconductor material portion 76 is formed on the top surface of the contact-level dielectric layer 70. The first semiconductor material portions 66 and the second semiconductor material portion 76 are deposited concurrently in a same gas cluster ion beam deposition process. The entirety of the second semiconductor material portion 76 can be a contiguous sheet of a deposited semiconductor material that extends across the entirety of the top surface of the contact-level dielectric layer 70, and including openings in regions of the contact trenches 62. In one embodiment, the semiconductor material can be deposited employing a beam of electrically charged clusters of atoms that travel along a direction that is substantially parallel to a surface normal of the topmost surface of the contact-level dielectric layer 70. Each first semiconductor material portion 66 can be deposited on the recessed top surface of a raised semiconductor material region 62, and can contact sidewall surfaces of the raised semiconductor material region 62.

The gas cluster ion beam ion deposition is a technique in which clusters of material are electrically charged and beamed to treat a surface. In one embodiment, the semiconductor material can be deposited as clusters of atoms having more than 10 semiconductor atoms per cluster on average during the ion cluster deposition. In one embodiment, the number of atoms in each cluster can be from 50 atoms to 1,000,000 atoms on average. In one embodiment, the number of atoms in each cluster can be from 1,000 to 100,000 atoms on average.

In one embodiment, the acceleration voltage of an ion cluster deposition tool employed to generate the beam of electrically charged clusters of atoms can be in a range from 5 V to 60 kV, and the corresponding kinetic energy of each electrically charged cluster of atoms can be in a range from 5 eV to 60 keV. In one embodiment, the acceleration voltage of an ion cluster deposition tool employed to generate the beam of electrically charged clusters of atoms can be in a range from 40 V to 55 kV, and the corresponding kinetic energy of each electrically charged cluster of atoms can be in a range from 40 eV to 55 keV. The kinetic energy per atom can be in a range from 0.1 eV to 10 eV, although lesser and greater kinetic energy per atom can also be employed.

The kinetic energy per atom in the beam of electrically charged clusters of atoms is selected such that the semiconductor material of the electrically charged clusters of atoms do not penetrate through the top surfaces of the raised semiconductor material regions 62, but are added onto the top surfaces of the raised semiconductor material regions 62. Also, the semiconductor material of the electrically charged clusters of atoms is added onto, and above, the top surface of the contact-level dielectric layer 70. The semiconductor material of the first semiconductor material portions 66 and the second semiconductor material portion 76 can be silicon, germanium, a III-V compound semiconductor material, a II-VI semiconductor material, or any other semiconductor material known in the art. In one embodiment, the semiconductor material of the first semiconductor material portions 66 and the second semiconductor material portion 76 can be silicon. The thickness of the first semiconductor material portions 66 and the second semiconductor material portion 76 can be from 1 nm to 100 nm, although lesser and greater thicknesses can also be employed. In one embodiment, the thickness of the first semiconductor material portions 66 and the second semiconductor material portion 76 can be from 3 nm to 30 nm.

It is noted that chemical vapor deposition processes are not suitable for avoiding deposition of a semiconductor material on sidewalls of the contact trenches 69 because no mechanism is provided for suppressing deposition of the semiconductor material on sidewall of the contact trenches 69. Selective deposition of a semiconductor material, such as silicon, by chemical vapor deposition (such as selective epitaxy) requires a deposition temperature greater than 500 degrees, which is not suitable for use in conjunction with a replacement gate integration scheme. Highly collimated physical vapor deposition (PVD) results in non-uniform deposition at the bottom of the contact trenches 69, i.e., the thickness of the deposited semiconductor material has a greater thickness at the center than at the periphery of the contact trenches 69, and thus, results in significant consumption of the underlying semiconductor material at the peripheries of each contact trench 69. In other words, even highly collimated PVD is ineffective in providing a significant amount of semiconductor material at peripheral portions of each contact trench 69. Conventional ion implantation results in implantation of materials through the bottom surface of the contact trenches 69, and accompanying damages in crystallographic structures in the underlying semiconductor material portions. Gas cluster ion cluster deposition overcomes the difficulties of chemical vapor deposition, physical vapor deposition, and conventional ion implantation of semiconductor materials.

Figure 9:
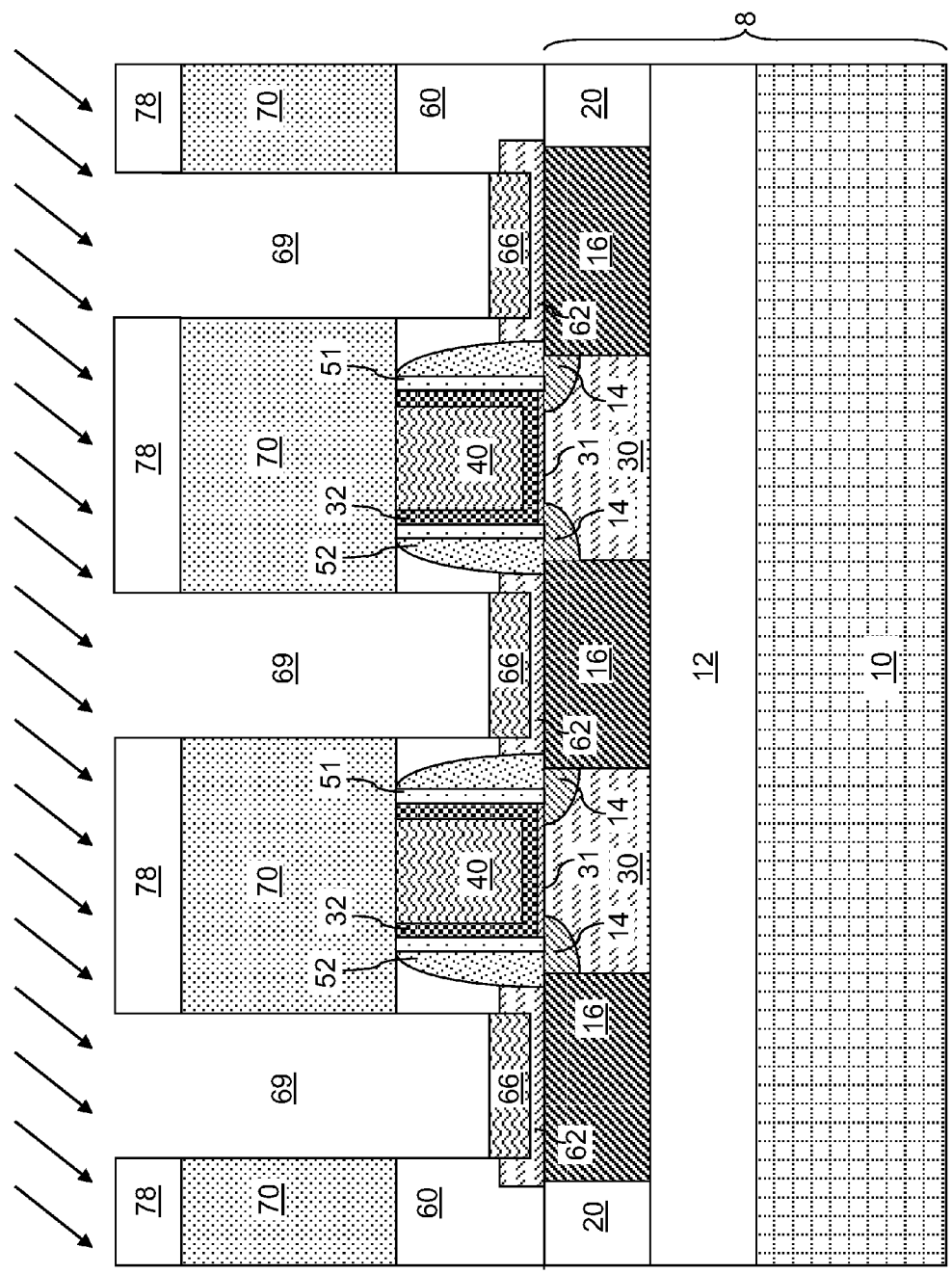
FIG. 9 is a vertical cross-sectional view of the exemplary semiconductor structure during angled gas cluster ion cluster deposition of oxygen to convert the second semiconductor material portion into a semiconductor oxide portion according to an embodiment of the present disclosure.

Referring to FIG. 9, oxygen is implanted into the second semiconductor material portion 76 to convert the second semiconductor material portion 76 into a semiconductor oxide portion 78, while oxygen is not implanted into the first semiconductor material portions 66. A directional beam of oxygen can be employed to implant oxygen into the second semiconductor material portion 76.

In one embodiment, oxygen can be implanted into the second semiconductor material portion 76 at a non-zero angle to the surface normal of the topmost surface of the contact-level dielectric layer 70. The non-zero angle can be selected such that the bottom surface of each contact trench 69 is shielded from the directional beam of oxygen by the contact-level dielectric layer 70 during the implanting of oxygen. Specifically, the angle of the directional oxygen cluster deposition, as measured by the tilt angle of the beam direction with respect to the surface normal of the topmost surface of the contact-level dielectric layer 70, can be greater than the arctangent of the ratio of the width of the widest contact trench among the contact trenches 69 to the distance between the topmost surface of the second semiconductor material portion 76 and the topmost surface of the first semiconductor material portions 66. Thus, the first semiconductor material portions 66 do not change any composition during the conversion of the second semiconductor material portion 76 into the semiconductor oxide portion 78.

In oxygen cluster deposition, oxygen molecules are generated in the form of electrically charged clusters of oxygen molecules. In one embodiment, the clusters of oxygen molecules can include than 10 oxygen molecules per cluster on average during the ion implantation. In one embodiment, the number of oxygen molecules in each cluster can be from 50 atoms to 1,000,000 atoms on average. In one embodiment, the number of oxygen molecules in each cluster can be from 1,000 to 100,000 atoms on average.

In one embodiment, the acceleration voltage of an ion cluster deposition tool employed to generate the beam of electrically charged clusters of oxygen molecules can be in a range from 5 V to 60 kV, and the corresponding kinetic energy of each electrically charged cluster of oxygen molecules can be in a range from 5 eV to 60 keV. In one embodiment, the acceleration voltage of an ion cluster deposition tool employed to generate the beam of electrically charged clusters of atoms can be in a range from 40 V to 55 kV, and the corresponding kinetic energy of each electrically charged cluster of oxygen molecules can be in a range from 40 eV to 55 keV. The kinetic energy per oxygen molecule can be in a range from 0.1 eV to 10 eV, although lesser and greater kinetic energy per atom can also be employed.

The kinetic energy per oxygen molecule in the beam of electrically charged clusters of oxygen molecules is selected such that the oxygen molecules do not penetrate through the second semiconductor material portion 76, but combine with the semiconductor material of the second semiconductor material portion 76. The dose of the directional oxygen cluster deposition is selected such that the entirety of the second semiconductor material portion 76 is converted into a semiconductor oxide material.

Figure 10:
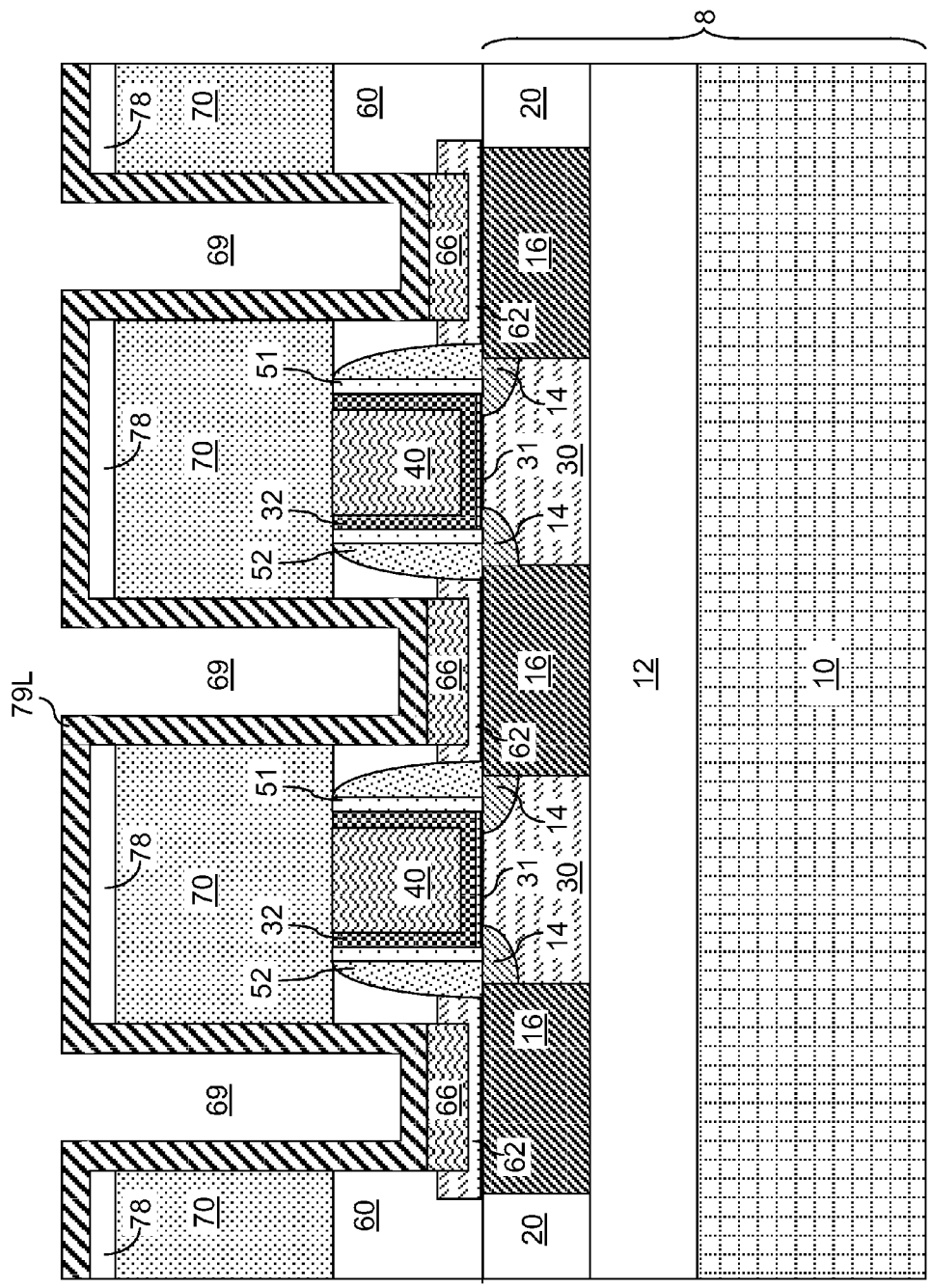
FIG. 10 is a vertical cross-sectional view of the exemplary semiconductor structure after deposition of a metal layer according to an embodiment of the present disclosure.

Referring to FIG. 10, a preclean can be performed on the first semiconductor material portions 66 to remove any surface impurities or interfacial oxides. The preclean can be, for example, a wet etch, or a plasma etch (such as Siconi etch), which can collaterally remove all or portions of the semiconductor oxide portion 78 selective to the first semiconductor material portions 66. A metal layer 79L is deposited on the surfaces of the first semiconductor material portions 66, for example, by physical vapor deposition or chemical vapor deposition. If the semiconductor oxide portion 78 is not completely removed during the preclean, the metal layer 79L can be deposited on the semiconductor oxide portion 78. In this case, the metal layer 79L can be deposited on remaining portions of the semiconductor oxide layer 78 that is located on the topmost surface of the contact-level dielectric layer 70. If the semiconductor oxide portion 78 is completely removed during the preclean of the metal layer 79L, the metal layer 79L can be deposited on the top surface of the contact-level dielectric layer 70.

The metal layer 79L can include a transition metal such as Ni, Co, Pt, W, Ti, and/or Ta. The thickness of the metal layer 79L on the sidewalls of the planarization dielectric layer 60 and the contact-level dielectric layer 70 can be from 0 to 100% of the thickness of the portion of the metal layer 79L on top of the first semiconductor material portions 66. Unless the metal layer 79L is deposited employing a collimated deposition method such as collimated physical vapor deposition, the metal layer 79L may be deposited on the sidewalls of the contact trenches 69, i.e., on the sidewalls of the planarization dielectric layer 60 and the contact-level dielectric layer 70. The thickness of the metal layer 79L on top of the first semiconductor material portions 66 can be from 2 nm to 40 nm, although lesser and greater thicknesses can also be employed.

Figure 11:
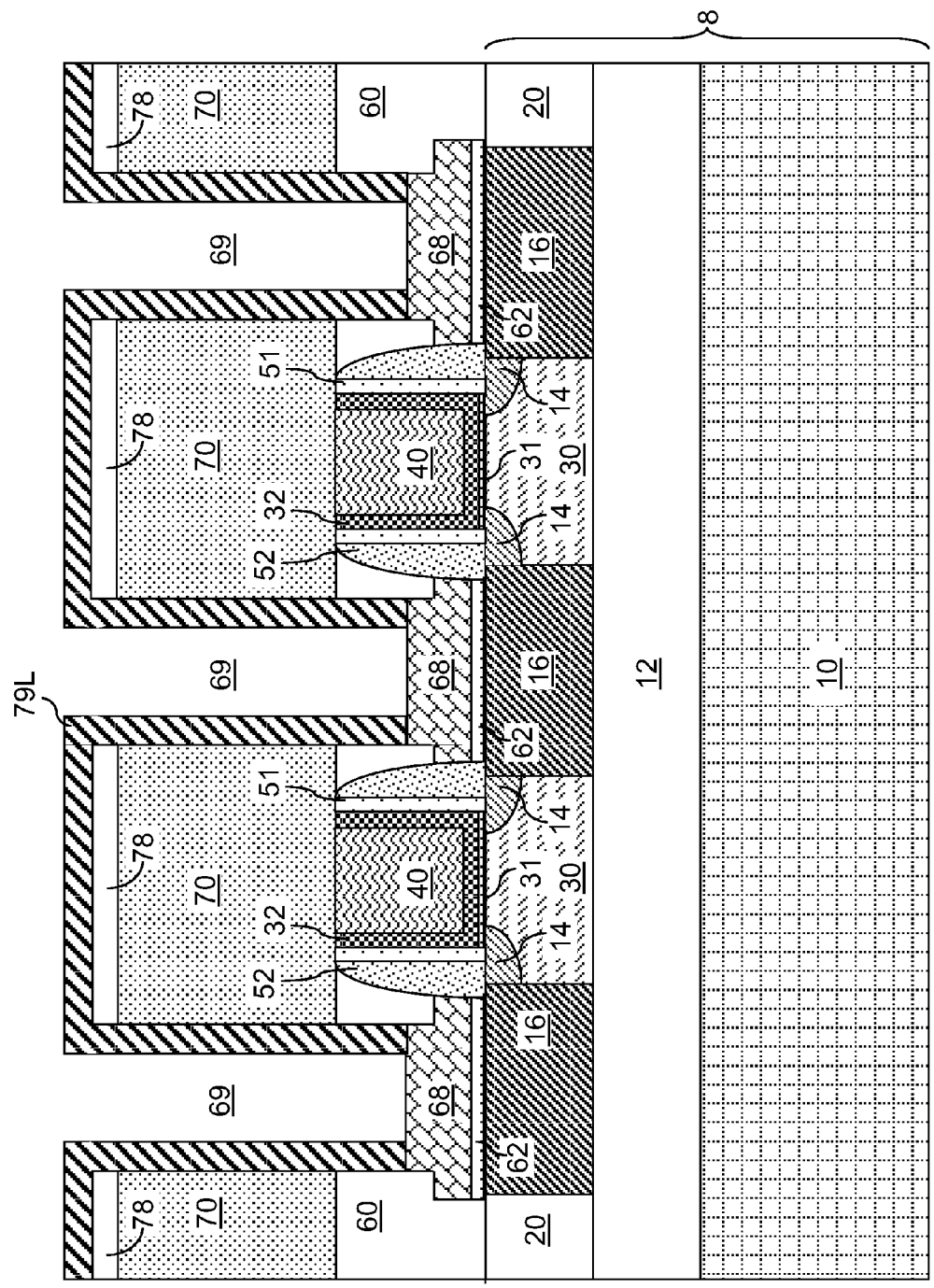
FIG. 11 is a vertical cross-sectional view of the exemplary semiconductor structure after formation of metal semiconductor alloy regions according to an embodiment of the present disclosure.

Referring to FIG. 11, an anneal is performed at an elevated temperature to induce reaction of the semiconductor material of the first semiconductor material portions 66 and the metal in the metal layer 79L. A metal semiconductor alloy region 68 is formed at the bottom of each contact trench 69 between a remaining portion of the first semiconductor material portion 66 and a remaining portion of the metal layer 79L. Each metal semiconductor alloy region 68 includes a material, i.e., a metal semiconductor alloy, which is derived from a first semiconductor material portion 62.

In one embodiment, the first semiconductor material portions 62 can include silicon, and the metal semiconductor alloy regions 68 can include a metal silicide. The first semiconductor material portion 62 may be completely consumed, or may be partially consumed, by reaction with the metal layer 79L during the anneal that forms the metal semiconductor alloy regions 68. A peripheral portion of each metal semiconductor alloy region 68 may contact a bottom surface of the planarization dielectric layer 60.

Figure 12:
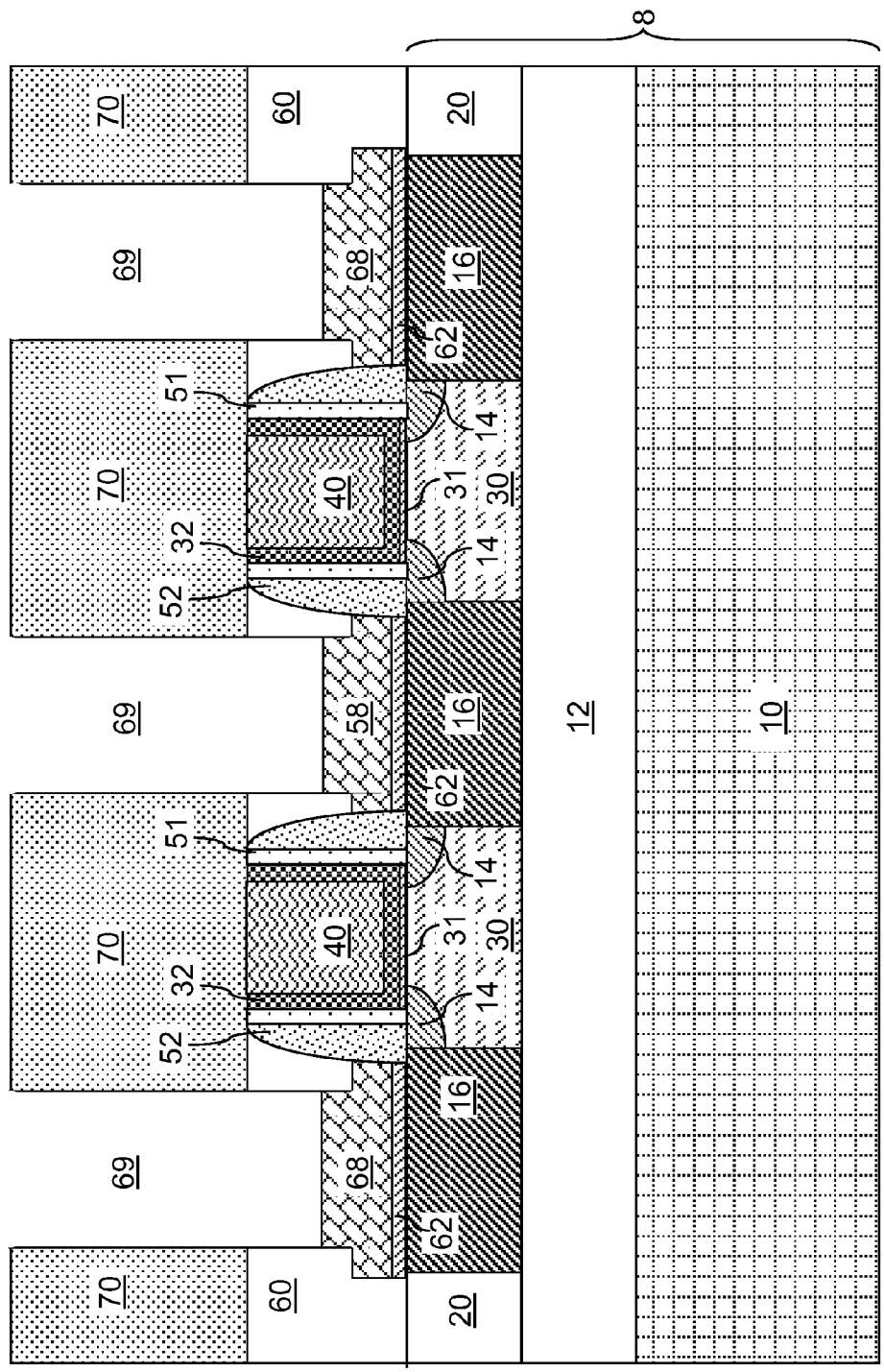
FIG. 12 is a vertical cross-sectional view of the exemplary semiconductor structure after removal of unreacted portions of the metal layer according to an embodiment of the present disclosure.

Referring to FIG. 12, unreacted portions of the metal layer 79L are removed, for example, by an etch, which can be a wet etch that removes the metal in the metal layer 79L selective to the metal semiconductor alloy in the metal semiconductor alloy regions 68. The wet etch can collaterally remove any remaining portion of the semiconductor oxide portion 78 selective to the metal semiconductor alloy regions 68. The wet etch can be combined with a postclean that removes any remnants of the metal layer 79L from surfaces of the contact-level dielectric layer 70 and the planarization dielectric layer 60.

Figure 13:
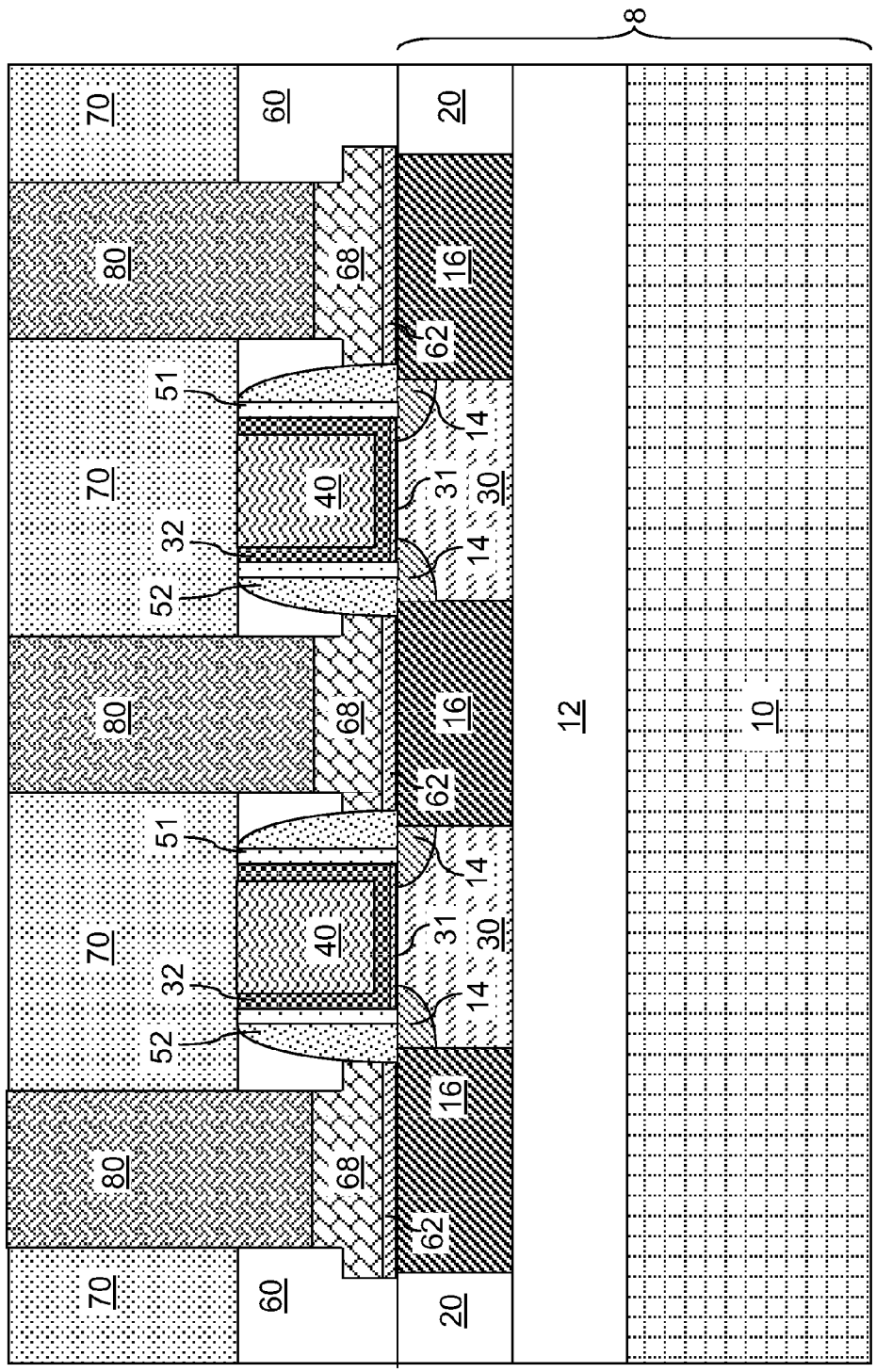
FIG. 13 is a vertical cross-sectional view of the exemplary semiconductor structure after formation of contact via structures according to an embodiment of the present disclosure.

Referring to FIG. 13, contact via structures 80 are formed in the contact trenches 69. The contact via trenches 80 can be formed, for example, by depositing a conductive material in the contact trenches 69 and directly on the metal semiconductor alloy regions 68, and by planarizing the conductive material employing the contact-level dielectric layer 70 as a stopping layer. Each remaining portion of the conductive material after planarization can be one of the contact via structures 80.

The addition of a semiconductor material on top of the recessed surfaces of the first semiconductor material portions 66 after formation of the contact trenches 69 has the effect of raising the bottommost surface of the metal semiconductor alloy regions 68, thereby reducing the leakage current between each metal semiconductor alloy regions 68 and the body region 30 of each field effect transistor.

The methods of the present disclosure can be employed in a gate-first integration scheme in which a permanent gate structure including a gate dielectric and a gate electrode are formed instead of each disposable gate structures (25, 27, 29; See FIG. 1) and the processing steps of replacing the disposable gate structures (25, 27, 29) with replacement gate structures (31, 32, 40; See FIG. 5) as illustrated in FIGS. 4 and 5 are omitted. Further, the combination of the planarization dielectric layer 60 and the contact-level dielectric layer 70 can be replaced with at least one dielectric layer having a planar top surface, and the contact trenches 62 can be formed through the at least one dielectric layer.

The position of the metal semiconductor alloy region 68 of the present disclosure is raised above the position of a comparative structure in which first semiconductor material portions 66 are not formed because of the thickness of the metal semiconductor alloy region 68 can be limited by the thickness of the metal layer 79L and/or the anneal conditions. Thus, the metal semiconductor alloy region 68 are structurally "raised" above a comparable metal semiconductor alloy region that can be formed in semiconductor structures that do not deposit a semiconductor material at a bottom of a contact trench, and thus, is referred to as a "raised" trench metal semiconductor alloy structure.

While the disclosure has been described in terms of specific embodiments, it is evident in view of the foregoing description that numerous alternatives, modifications and variations will be apparent to those skilled in the art. Each of the various embodiments of the present disclosure can be implemented alone, or in combination with any other embodiments of the present disclosure unless expressly disclosed otherwise or otherwise impossible as would be known to one of ordinary skill in the art. Accordingly, the disclosure is intended to encompass all such alternatives, modifications and variations which fall within the scope and spirit of the disclosure and the following claims.

What is claimed is:

1. A method of forming a semiconductor structure comprising:
    forming at least one dielectric layer over a substrate;
    forming a trench at least through said at least one dielectric layer;
    concurrently depositing a first semiconductor material portion at a bottom surface of said trench and a second semiconductor material portion at a topmost surface of said at least one dielectric layer, respectively, without depositing any material on sidewalls of said trench; and
    converting said second semiconductor material portion into a semiconductor oxide portion while a composition of said first semiconductor material portion remains the same.

2. The method of claim 1, wherein said substrate comprises a semiconductor material layer, and said method comprises:
    forming a raised semiconductor material region on a top surface of said semiconductor material layer; and
    vertically recessing said raised semiconductor material region during formation of said trench.

3. The method of claim 2, wherein sidewall surfaces and a recessed top surface of said raised semiconductor material region are physically exposed after formation of said trench.

4. The method of claim 3, wherein said first semiconductor material portion is deposited on said recessed top surface of said raised semiconductor material region.

5. The method of claim 1, wherein said first semiconductor material portion is deposited by ion cluster deposition of a semiconductor material.

6. The method of claim 5, wherein said semiconductor material is deposited as clusters of atoms having more than 10 semiconductor atoms per cluster on average during said ion cluster deposition.

7. The method of claim 6, wherein said semiconductor material is deposited employing a beam of electrically charged clusters of atoms that travel along a direction that is substantially parallel to said surface normal of said topmost surface of said at least one dielectric layer.

8. The method of claim 1, wherein said conversion of said second semiconductor material portion into said semiconductor oxide portion comprises implanting oxygen into said second semiconductor material portion while oxygen is not implanted into said first semiconductor material portion.

9. The method of claim 8, wherein said implanting of oxygen into said second semiconductor material portion comprises implanting oxygen at a non-zero angle to a surface normal of said topmost surface of said at least one dielectric layer.

10. The method of claim 9, wherein said non-zero angle is selected such that a bottom surface of said trench is shielded from a beam of oxygen during said implanting of oxygen by said at least one dielectric layer.

11. The method of claim 1, further comprising removing said semiconductor oxide portion.

12. The method of claim 11, further comprising performing a wet etch that removes said semiconductor oxide portion.

13. The method of claim 1, further comprising forming a metal semiconductor alloy region including a material derived from said first semiconductor material portion at a bottom of said trench.

14. The method of claim 13, wherein said forming of said metal semiconductor alloy region comprises:
  depositing a metal layer in said trench and over said topmost surface of said at least one dielectric layer; and
  reacting said first semiconductor material portion with said metal layer to form said metal semiconductor alloy region.

15. The method of claim 14, wherein said metal layer is deposited on remaining portions of said semiconductor oxide layer on said topmost surface of said at least one dielectric layer and on sidewalls of said at least one dielectric layer.

16. The method of claim 15, further comprising forming a contact via structure in said trench.

17. The method of claim 16, wherein said forming of said contact via structure comprises:
  depositing a conductive material in said trench and directly on said metal semiconductor alloy region; and
  planarizing said conductive material employing said at least one dielectric layer as a stopping layer, wherein a remaining portion of said conductive material after planarization is said contact via structure.

18. The method of claim 1, further comprising:
  forming a stack of a gate dielectric and a gate electrode on said substrate; and
  forming a source region and a drain region in said substrate, wherein said first semiconductor material portion is electrically shorted to one of said source region and said drain region.

19. The method of claim 18, further comprising forming a raised source region on said source region and a raised drain region on said drain region by selective epitaxy, wherein a surface of one of said raised source region and raised drain region is physically exposed at a bottom of said trench.

20. The method of claim 19, wherein said at least one dielectric layer is formed by:
  forming a planarization dielectric layer having a top surface that is substantially planar with a top surface of said gate electrode; and
  forming a contact-level dielectric layer by depositing a dielectric material over said planarization dielectric layer, wherein said topmost surface of said at least one dielectric layer is a top surface of said contact-level dielectric layer.

* * * * *